(12) United States Patent
Lee et al.

(10) Patent No.: US 11,682,698 B2
(45) Date of Patent: Jun. 20, 2023

(54) SEMICONDUCTOR DEVICES INCLUDING SOURCE/DRAIN REGIONS HAVING ANTIMONY DOPED LAYERS

(71) Applicant: Samsung Electronics Co., Ltd., Suwon-si (KR)

(72) Inventors: Junghan Lee, Anyang-si (KR); Changhee Kim, Suwon-si (KR); Kihwan Kim, Suwon-si (KR); Suhyueon Park, Bucheon-si (KR); Jaehong Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/541,878

(22) Filed: Dec. 3, 2021

(65) Prior Publication Data
US 2022/0093739 A1 Mar. 24, 2022

Related U.S. Application Data

(63) Continuation of application No. 16/821,491, filed on Mar. 17, 2020, now Pat. No. 11,211,454.

(30) Foreign Application Priority Data

Sep. 2, 2019 (KR) .................. 10-2019-0108142

(51) Int. Cl.
*H01L 29/08* (2006.01)
*H01L 21/8234* (2006.01)
(Continued)

(52) U.S. Cl.
CPC .. *H01L 29/0847* (2013.01); *H01L 21/823418* (2013.01); *H01L 21/823431* (2013.01);
(Continued)

(58) Field of Classification Search
CPC ............... H01L 29/086; H01L 29/0865; H01L 29/0869; H01L 29/0878; H01L 29/0882;
(Continued)

(56) References Cited

U.S. PATENT DOCUMENTS 7,618,866 B2  11/2009  Luo et al.
9,117,843 B2  8/2015  Wong et al.
(Continued)

*Primary Examiner* — Sonya McCall-Shepard
(74) *Attorney, Agent, or Firm* — Harness, Dickey & Pierce, P.L.C.

(57) ABSTRACT

A semiconductor device including an active region protruding from an upper surface of a substrate and extending in a first horizontal direction, at least two gate electrodes extending in a second horizontal direction and crossing the active region, the second horizontal direction crossing the first horizontal direction, a source/drain region in the active region between the gate electrodes may be provided. The source/drain region includes a recess region, an outer doped layer on an inner wall of the recess region, an intermediate doped layer on the outer doped layer, and an inner doped layer on the intermediate doped layer and filling the recess region. One of the outer doped layer or the intermediate doped layer includes antimony, and the inner doped layer includes phosphorous.

20 Claims, 15 Drawing Sheets

(51) Int. Cl.

| | | |
|---|---|---|
| *H01L 27/088* | (2006.01) | |
| *H01L 29/78* | (2006.01) | |
| *H01L 29/167* | (2006.01) | |
| *H01L 29/423* | (2006.01) | |
| *H01L 29/786* | (2006.01) | |
| *H01L 29/06* | (2006.01) | |
| *H01L 29/36* | (2006.01) | |

(52) U.S. Cl.
CPC ........ *H01L 27/0886* (2013.01); *H01L 29/086* (2013.01); *H01L 29/0865* (2013.01); *H01L 29/0869* (2013.01); *H01L 29/0878* (2013.01); *H01L 29/0882* (2013.01); *H01L 29/0886* (2013.01); *H01L 29/167* (2013.01); *H01L 29/42392* (2013.01); *H01L 29/78696* (2013.01)

(58) Field of Classification Search
CPC ............. H01L 29/0886; H01L 29/0843; H01L 29/0847; H01L 21/823418; H01L 21/823425; H01L 21/823814; H01L 29/78696; H01L 21/823412; H01L 29/7848; H01L 21/823807; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 29/42392; H01L 29/167; H01L 21/0257; H01L 29/12; H01L 2924/01015; H01L 2924/01033; H01L 2924/01051

See application file for complete search history.

(56) References Cited

U.S. PATENT DOCUMENTS

| | | | |
|---|---|---|---|
| 9,287,122 B2 | 3/2016 | Yu et al. | |
| 9,673,324 B1 | 6/2017 | Wu et al. | |
| 9,786,782 B2 * | 10/2017 | Balakrishnan | ........ H01L 29/785 |
| 9,853,129 B2 | 12/2017 | Bauer et al. | |
| 9,966,433 B2 | 5/2018 | Li et al. | |
| 10,096,672 B2 | 10/2018 | Chen et al. | |
| 10,109,628 B2 | 10/2018 | Murthy et al. | |
| 11,342,442 B2 * | 5/2022 | Brueck | ............. H01L 21/02639 |
| 2018/0097112 A1 | 4/2018 | Basker et al. | |
| 2018/0151674 A1 | 5/2018 | Cheng et al. | |
| 2018/0151730 A1 | 5/2018 | Ma et al. | |
| 2019/0198616 A1 * | 6/2019 | Coquand | ........... H01L 29/41725 |
| 2020/0176566 A1 | 6/2020 | Peng et al. | |
| 2021/0028280 A1 | 1/2021 | Liu et al. | |

\* cited by examiner

SEMICONDUCTOR DEVICES INCLUDING SOURCE/DRAIN REGIONS HAVING ANTIMONY DOPED LAYERS

CROSS-REFERENCE TO RELATED APPLICATION

This application is a continuation of U.S. application Ser. No. 16/821,491, filed on Mar. 17, 2020, which claims priority under 35 U.S.C. § 119 to Korean Patent Application No. 10-2019-0108142, filed on Sep. 2, 2019, the disclosure of each of which is incorporated herein by reference in its entirety.

BACKGROUND

1. Field

Example embodiments relate to semiconductor devices including source/drain regions having antimony doped layer.

2. Description of Related Art

As the demand for high integration and miniaturization of semiconductor devices is increasing, the size of transistors in semiconductor devices has also been miniaturized. As a result, the channel distance of the transistor is shortened and the distance between the source/drain regions becomes small. Thus, diffusion of impurities from the source/drain regions into the channel becomes problematic.

SUMMARY

Example embodiments of inventive concepts relate to semiconductor devices including source/drain regions capable of mitigating or preventing undesired diffusion of impurities.

According to some example embodiments, a semiconductor device may include an active region protruding from an upper surface of a substrate and extending in a first horizontal direction, at least two gate electrodes extending in a second horizontal direction and crossing the active region, the second horizontal direction crossing the first horizontal direction, and a source/drain region in the active region between the gate electrodes. The source/drain region may include a recess region, an outer doped layer on an inner wall of the recess region, an intermediate doped layer on the outer doped layer, and an inner doped layer on the intermediate doped layer and filling the recess region. One of the outer doped layer or the intermediate doped layer may include antimony, and the inner doped layer may include phosphorous.

According to some example embodiments, a semiconductor device may include an active region protruding from an upper surface of a substrate and extending in a first horizontal direction, a plurality of channel layers spaced apart from each other in a vertical direction on the active region, a plurality of gate electrodes extending in a second horizontal direction and surrounding the plurality of the channel layers, the second horizontal direction crossing the first horizontal direction, and a source/drain region between an adjacent pair of the plurality of gate electrodes, the source/drain region including outer doped layers in contact with the plurality of channel layers, intermediate doped layers covering the outer doped layers, and inner doped layers covering the intermediate doped layers. The outer doped layers may include antimony, the intermediate doped layers may include arsenic, and the inner doped layers may include phosphorous.

According to some example embodiments, a semiconductor device may comprise an active region protruding from an upper surface of a substrate and extending in a first horizontal direction, at least two gate electrodes extending in a second horizontal direction and crossing the active region, the second horizontal direction crossing the first horizontal direction, a source/drain region in the active region between the gate electrodes and having a rounded lower surface, the source/drain region having an upper surface higher than an upper surface of the active region. The source/drain region may include an inner doped layer, an intermediate doped layer surrounding a lower portion of the inner doped layer, and an outer doped layer surrounding a lower portion of the intermediate doped layer. The inner doped layer may include phosphorous, the intermediate doped layer may include arsenic, and the outer doped layer may include antimony. A doping concentration of the outer doped layer may be lower than a doping concentration of the intermediate doped layer.

BRIEF DESCRIPTION OF THE DRAWINGS

The above and other objects, features, and advantages of inventive concepts will become more apparent to those of ordinary skill in the art by describing some example embodiments thereof in detail with reference to the accompanying drawings, in which.

DETAILED DESCRIPTION

Regardless of whether numerical values are modified as "about" or "substantially," it will be understood that these values in the present disclosure should be construed as including a manufacturing or operational tolerance (e.g., ±10%) around the stated numerical values.

Figure 1:
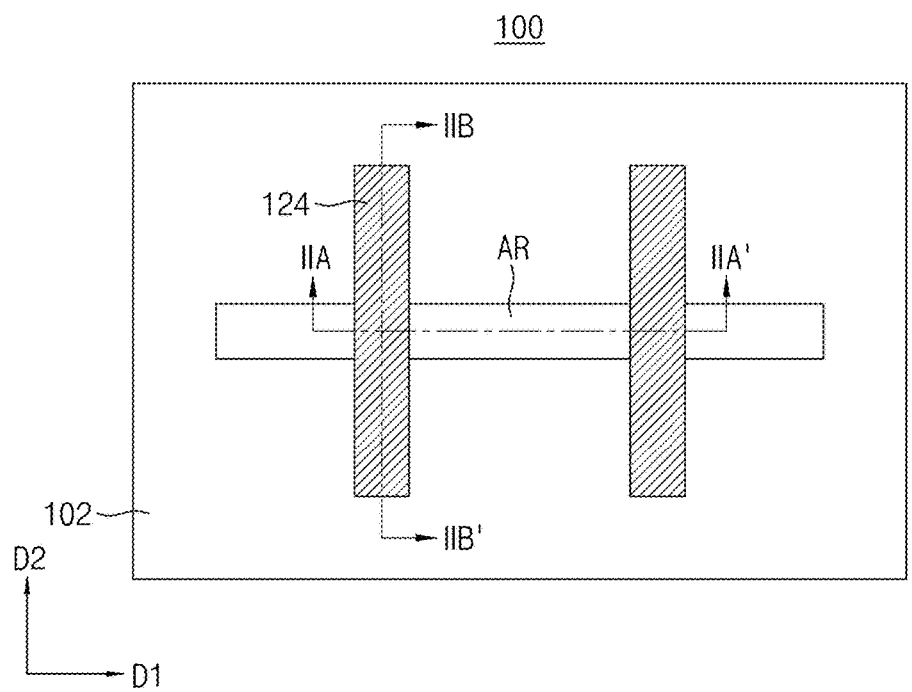
FIG. 1 is a layout of a semiconductor device according to an example embodiment of inventive concepts.
Figure 2:
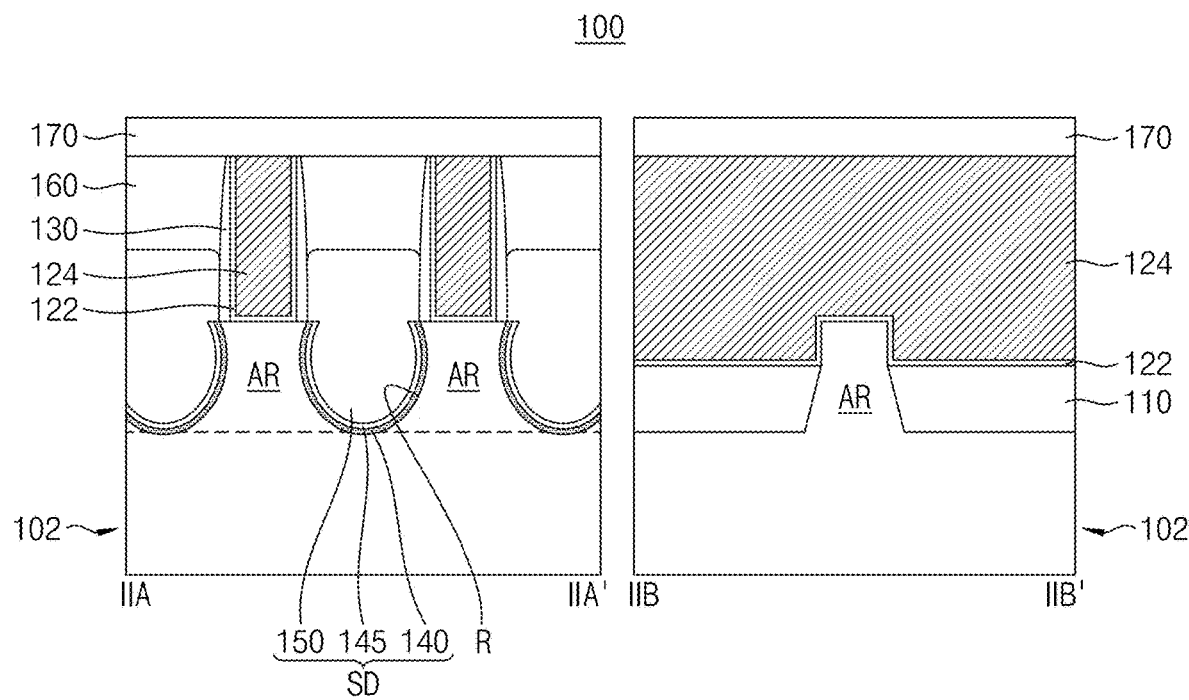
FIG. 2 are vertical cross-sectional views of the semiconductor device of FIG. 1, taken along lines IIA-IIA' and IIB-IIB'.

FIG. 1 is a layout of a semiconductor device according to an example embodiment of inventive concepts. FIG. 2 are vertical cross-sectional views of the semiconductor device of FIG. 1, taken along lines IIA-IIA' and IIB-IIB'.

Referring to FIG. 1 and FIG. 2, a semiconductor device 100 may include a substrate 102, a device isolation layer 110, an active region AR, a gate insulating layer 122, a gate electrode 124, and a gate spacer 130, an interlayer insulating layer 160, and a capping layer 170. The active region AR of the semiconductor device 100 may include a source/drain region SD including a recess region R, an outer doped layer 140, an intermediate doped layer 145, and an inner doped layer 150.

The substrate 102 may include a semiconductor material. For example, the substrate 102 may be a silicon substrate, a germanium substrate, a silicon germanium substrate, or a silicon on insulator (SOI) substrate. The active region AR may protrude from an upper surface of the substrate 102. The active region AR may have a fin shape and may extend in a first horizontal direction D1. The device isolation layer 110 may be disposed on the substrate 102 and may define the active region AR. An upper surface of the device isolation layer 110 may be located at a level lower than a level an upper surface of the active region AR.

The gate insulating layer 122 and the gate electrode 124 may cross the active region AR and extend in a second horizontal direction D2. The gate insulating layer 122 may cover the upper surface of the active region AR and the upper surface of the device isolation layer 110. Further, the gate insulating layer 122 may cover side and lower surfaces of the gate electrode 124.

The gate spacers 130 may be disposed outside the gate electrode 124. For example, the gate spacers 130 (e.g., the gate spacer 130 on left and the gate spacer 130 on right on the cross section along line IIA-IIA') may be disposed to face each other with respect to the gate electrode 124 interposed therebetween, and may extend in the second horizontal direction D2. The gate spacers 130 may be formed of one or more layers.

The source/drain region SD may be formed on/in the active region AR and may be disposed between the plurality of gate electrodes 124. The source/drain region SD may include the recess region R formed in the active region AR. An upper surface of the source/drain region SD may be positioned at a level higher than a level of the upper surface of the active region AR. Adjacent source/drain regions SD may be electrically connected through the active region AR.

The interlayer insulating layer 160 may cover the gate spacers 130 and the source/drain region SD. The interlayer insulating layer 160 may include silicon oxide, silicon nitride, silicon oxynitride, or a low dielectric material, and may be composed of one or more layers. Low dielectric materials include, for example, Undoped Silica Glass (USG), Borosilica Glass (BSG), Phosphosilica Glass (PSG), Borophosphosilica Glass (BPSG), Plasma Enhanced Tetra Ethyl Ortho Silicate (PPEOS), Fluoride Silicate Glass (FSG) (High Density Plasma) oxide or a combination thereof.

The capping layer 170 may be disposed on the interlayer insulating layer 160. The capping layer 170 may cover upper surfaces of the gate electrode 124, the gate spacers 130, and the interlayer insulating layer 160. The capping layer 170 may include, for example, silicon oxide, silicon nitride, silicon oxynitride, or a combination thereof.

Figure 3:
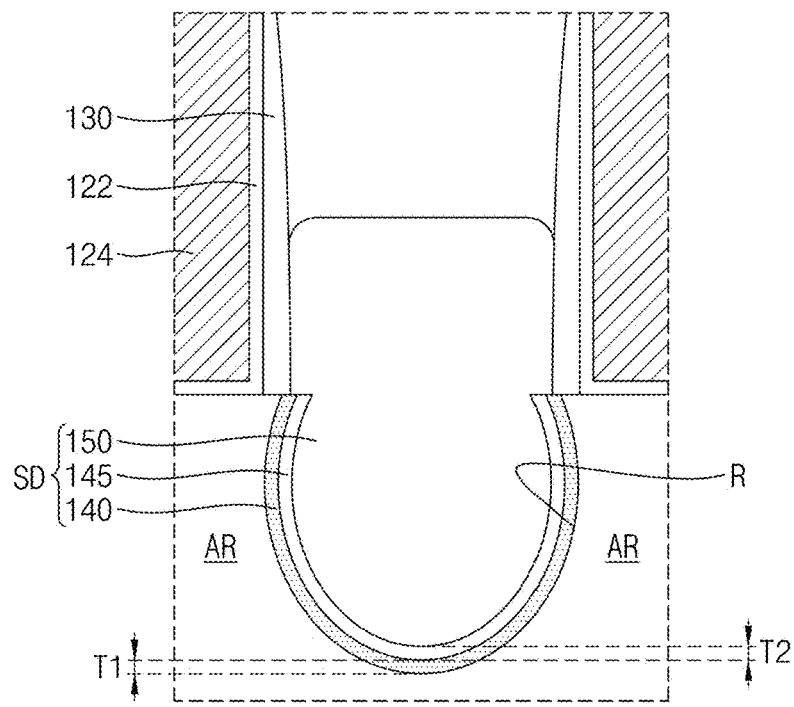
FIG. 3 is a partial enlarged view of the semiconductor device shown in FIG. 2.

FIG. 3 is a partial enlarged view of the semiconductor device shown in FIG. 2.

Referring to FIG. 3, the source/drain region SD may include the outer doped layer 140, the intermediate doped layer 145, and the inner doped layer 150. The source/drain region SD may include the recess region R. The outer doped layer 140 may cover an inner wall of the recess region R. The intermediate doped layer 145 may be disposed on/in the outer doped layer 140. The inner doped layer 150 may be disposed on/in the intermediate doped layer 145 and may fill the recess region R. In an example embodiment, the inner doped layer 150 may protrude inwardly from the surface of the active region AR, the intermediate doped layer 145 may surround the inner doped layer 150, and the outer doped layer 140 may surround the intermediate doped layer 145.

In an example embodiment, the outer doped layer 140 may be formed by selective epitaxial growth process using the active region AR as a seed layer, and the intermediate doped layer 145 may be formed by selective epitaxial growth process using the outer doped layer 140 as a seed layer. The inner doped layer 150 may be formed by selective epitaxial growth process using the intermediate doped layer 145 as a seed layer. The outer doped layer 140, the intermediate doped layer 145, and the inner doped layer 150 may be doped with n-type impurities by an in-situ method. In an example embodiment, the outer doped layer 140 and the intermediate doped layer 145 may include impurities being heavier and larger, and having a lower mobility than impurities in the inner doped layer 150. Therefore, the impurities doped in the outer doped layer 140 and the intermediate doped layer 145 may mitigate or prevent the impurities of the inner doped layer 150 from being diffused in the substrate 102 and the active region AR. In an example embodiment, the outer doped layer 140 may include impurities having a larger size, higher atomic number, and low mobility than the impurities in the intermediate doped layer 145. For example, the outer doped layer 140 may include antimony, and the intermediate doped layer 145 may include arsenic. The inner doped layer 150 may include phosphorus. The doping concentration of antimony in the outer doped layer 140 may be lower than the doping concentration of arsenic in the intermediate doped layer 145. In an example embodiment, the doping concentration of antimony may be $1\times10^{19}$~$2\times10^{20}$ atom/cm$^3$, and the doping concentration of arsenic may be $1\times10^{20}$~$2\times10^{21}$ atom/cm$^3$.

In an example embodiment, the outer doped layer 140 and the intermediate doped layer 145 may be formed conformally. The outer doped layer 140 may have a thickness T1 uniform of substantially uniform along side and lower surfaces of the recess region R. The intermediate doped layer 145 may have a thickness T2 uniform or substantially uniform along the upper surface of the outer doped layer 140. In FIG. 3, the thickness T1 has the same size as the thickness T2, but is not limited thereto.

As shown in FIG. 3, the outer doped layer 140 may disposed below the inner doped layer 150, and may be doped with a material that is heavier than a material (e.g., the impurities) of the inner doped layer 150, so that the outer doped layer 140 may act as a diffusion barrier for the impurities of the inner doped layer 150. Further, because the outer doped layer 140 and the intermediate doped layer 145 are disposed to act as a diffusion barrier of the double layer below the inner doped layer 150, the diffusion of impurities of the inner doped layer 150 may be more effectively reduced or prevented.

Figure 4:
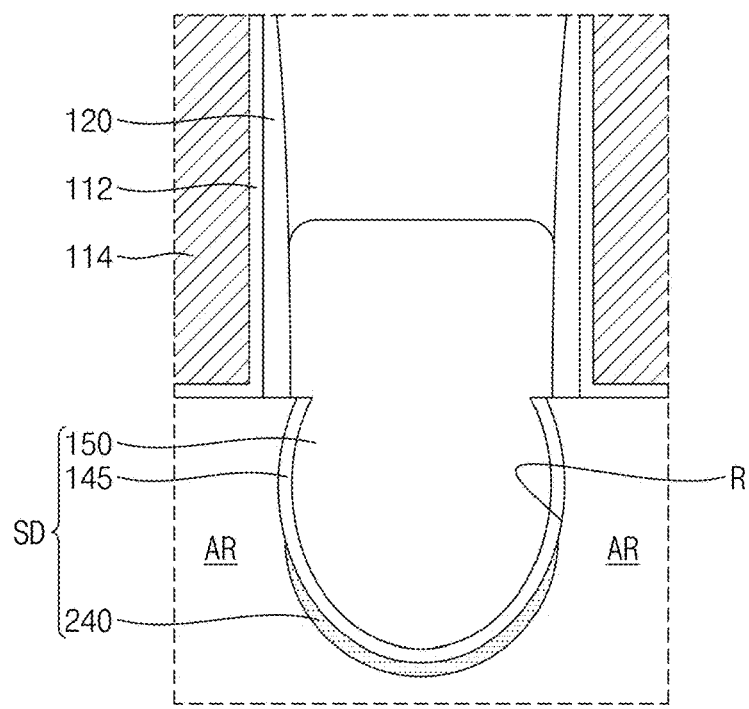
FIGS. 4-6 are partial enlarged views of the semiconductor device according to some example embodiments of inventive concepts.
Figure 5:
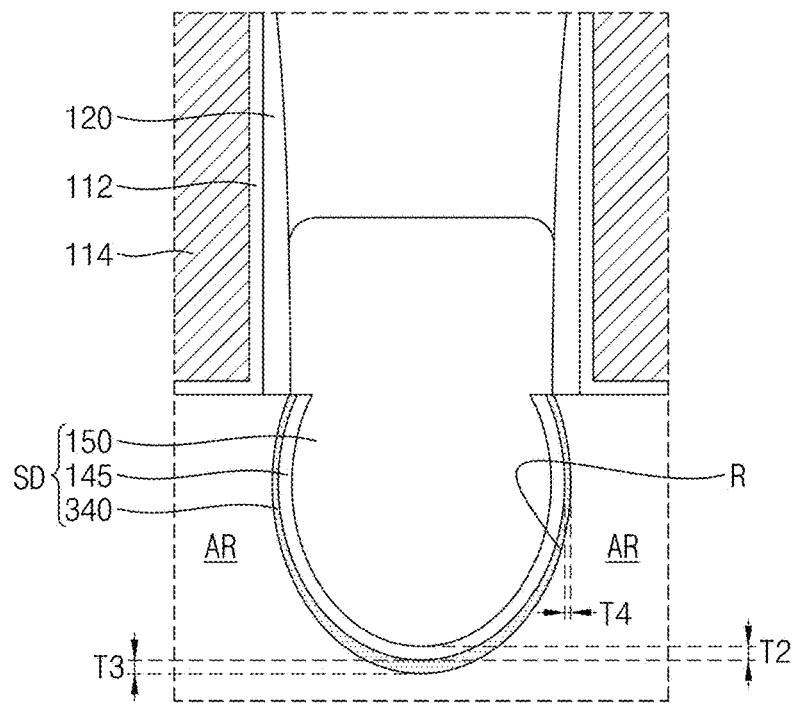
Figure 6:
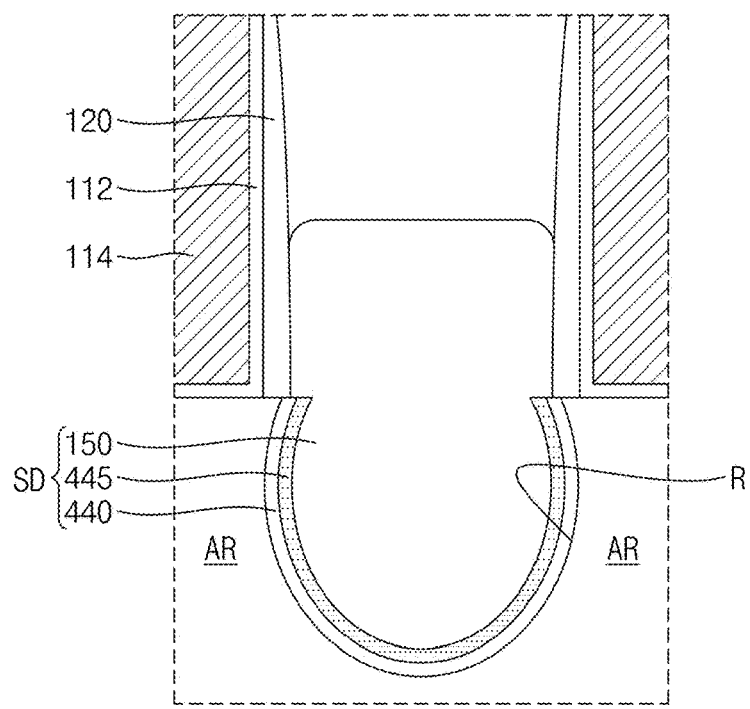

FIGS. 4-6 are partial enlarged views of the semiconductor device according to some example embodiments of inventive concepts. Detailed description of elements that are the same as or similar to those of the semiconductor device 100 of FIG. 3 may be omitted.

Referring to FIG. 4, a semiconductor device 200 may include an outer doped layer 240 surrounding a lower portion of an inner surface of the recess region R. The outer doped layer 240 may cover only the lower portion of the inner surface of the recess region R without covering an inner side surface of the recess region R. In other words, the outer doped layer 240 may cover only the lower portion of the inner surface of the recess region R instead of covering an entirety of the inner surface of the recess region R. For example, the height from the bottom of the outer doped layer 240 to the top of the outer doped layer 240 may be less than half the height from the bottom of the outer doped layer 240 to an upper surface of the active region AR. The intermediate doped layer 145 may cover the upper surface of the outer doped layer 240 and a side portion of the inner surface of the recess region R. The side portion of the inner surface of the recess region R refers to a portion of the inner surface of the recess region R that upwardly extends from the lower portion of the inner surface of the recess region R along a side of the recess region R and uncovered by the outer doped layer. In FIG. 4, the intermediate doped layer 145 has a uniform thickness, but is not limited thereto. In an example embodiment, a side portion of the intermediate doped layer 145 may have a thickness (e.g., side thickness) less than a thickness of a lower portion (e.g., lower thickness) of the intermediate doped layer 145. In an example embodiment, the inner doped layer 150 may protrude inward from the surface of the active region AR, the intermediate doped layer 145 may surround the inner doped layer 150, and the outer doped layer 240 may surround or cover a lower portion of the intermediate doped layer 145.

Referring to FIG. 5, a semiconductor device 300 may include an outer doped layer 340 covering an inner surface of the recess region R. The thickness of the outer doped layer 340 may not be uniform. In an example embodiment, the outer doped layer 340 may have a side thickness T4 that is less than the bottom thickness T3. In FIG. 5, the intermediate doped layer 145 has a uniform thickness, but is not limited thereto. In an example embodiment, the intermediate doped layer 145 may have a side thickness that is less than a bottom thickness.

Referring to FIG. 6, a semiconductor device 400 may include an outer doped layer 440 covering an inner wall of the recess region R, and an intermediate doped layer 445 formed on the outer doped layer 440. In an example embodiment, the intermediate doped layer 445 may include impurities that are heavier than impurities of the outer doped layer 440. For example, the outer doped layer 440 may include arsenic, and the intermediate doped layer 445 may include antimony. In FIG. 6, the outer doped layer 440 and the intermediate doped layer 445 have a uniform thickness, but are not limited thereto. In an example embodiment, the thickness of the outer doped layer 440 or the intermediate doped layer 445 may not be uniform. In an example embodiment, the outer doped layer 440 covers the inner wall of the recessed region R, and the intermediate doped layer 445 covers an inner wall of the outer doped layer 440.

FIGS. 7-14 are vertical cross-sectional views illustrating a method of manufacturing a semiconductor device shown in FIG. 2, according to an example embodiment of inventive concepts.

Figure 7:
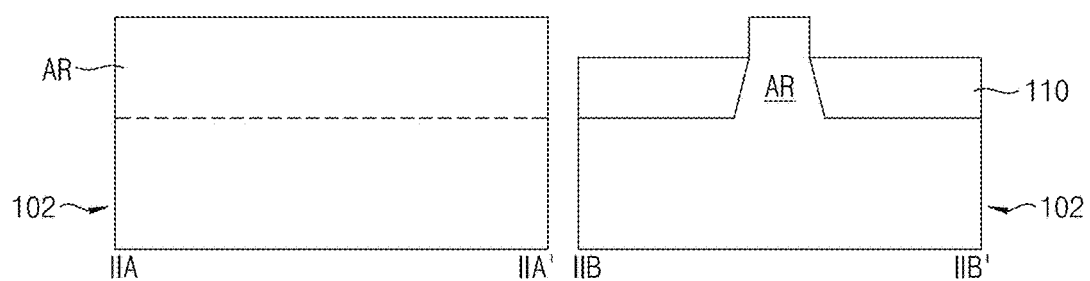
FIGS. 7-14 are vertical cross-sectional views illustrating in a method of manufacturing a semiconductor device shown in FIG. 2, according to an example embodiment of inventive concepts.

Referring to FIG. 7, a device isolation layer 110 may be formed on a substrate 102. The substrate 102 may include an active region AR protruding from an upper surface thereof. The active region AR may extend in the first horizontal direction D1. The substrate 102 may be patterned to form the active region AR having a fin shape. After an insulating layer formed on the substrate 102, an upper portion of the insulating layer may be etched to expose an upper portion of the active region AR, thereby forming the device isolation layer 110. In an example embodiment, device isolation layer 110 may include silicon oxide, silicon nitride, silicon oxynitride or a low-K dielectric material.

Figure 8:
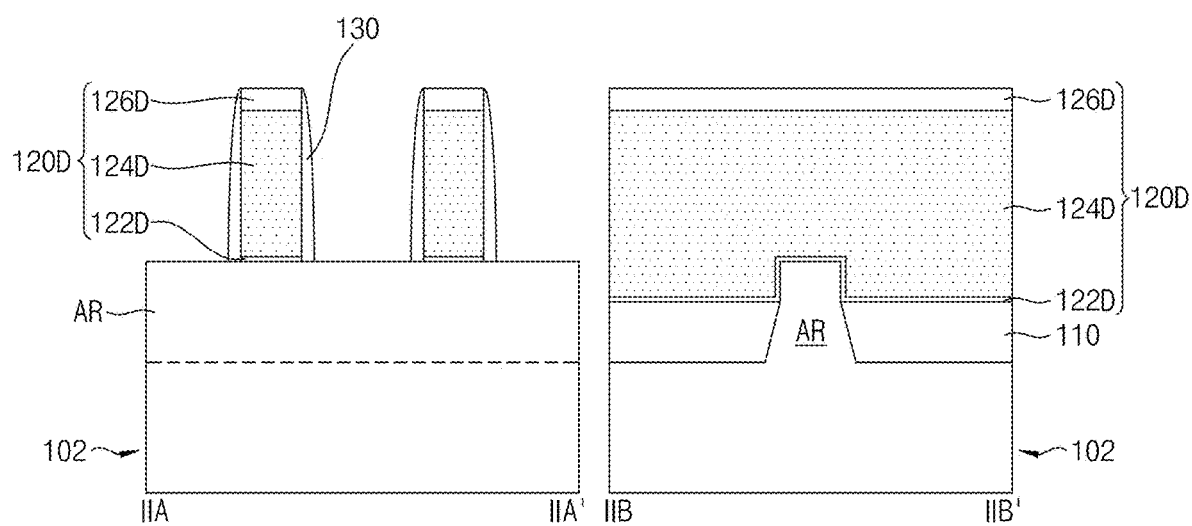

Referring to FIG. 8, a dummy gate structure 120D and gate spacers 130 may be formed. The dummy gate structure 120D may extend in the second horizontal direction D2 across the active region AR. The dummy gate structure 120D may include a dummy gate insulating layer 122D, a dummy gate electrode 124D, and a dummy capping layer 126D that are sequentially stacked. The gate spacers 130 may cover side surfaces of the dummy gate structure 120D and may be formed of one or more layers. After depositing an insulating material on the dummy gate structure 120D, the gate spacers 130 may be formed by anisotropic etching the insulating material.

The dummy gate insulating layer 122D may include silicon oxide, and may be formed by a method such as Chemical Vapor Deposition (CVD) or Atomic Layer Deposition (ALD). The dummy gate electrode 124D may include polysilicon. The dummy capping layer 126D may include silicon nitride, silicon oxynitride, or a combination thereof. The gate spacers 130 may include silicon nitride, silicon oxynitride, or a combination thereof.

Figure 9:
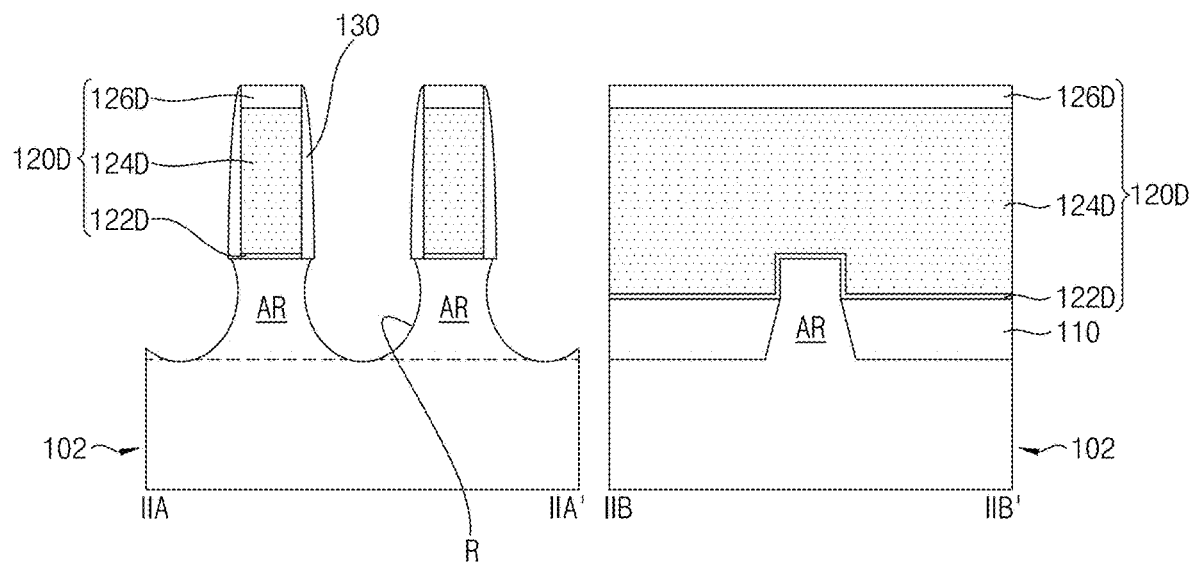

Referring to FIG. 9, the upper surface of the active region AR may be etched to form a recess region R. The recess region R may be disposed between adjacent dummy gate structures 120D. In an example embodiment, the process of etching the active region AR may include anisotropic etching and isotropic etching. The recess region R may be etched in the vertical direction and the horizontal direction, and the inner wall of the recess region R may be rounded. The exposed inner wall of the active region AR may be concave.

Figure 10:
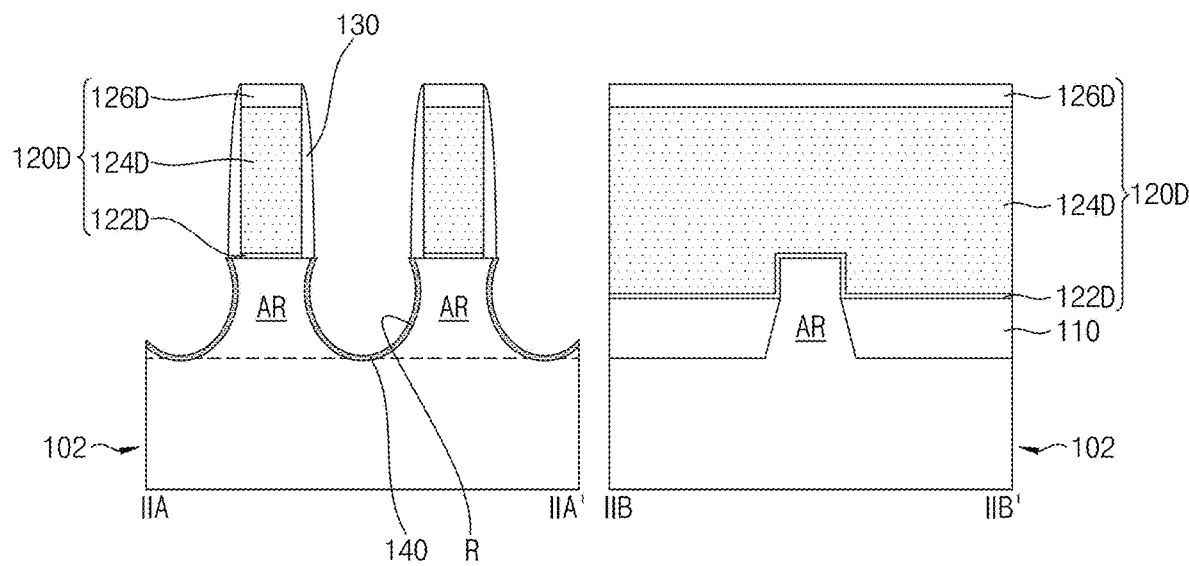

Referring to FIG. 10, an outer doped layer 140 may be formed on an inner wall of the recess region R. The outer doped layer 140 may be formed by selective epitaxial growth process using the active region AR as a seed layer. The outer doped layer 140 may be doped with n-type impurities by an in-situ method. In one example embodiment, the outer doped layer 140 may include antimony. In one example embodiment, the outer doped layer 140 may be formed conformally along the inner wall of the recess region R. In an example embodiment, a thickness of the outer doped layer 140 may not be uniform. For example, a bottom thickness of the outer doped layer 140 may be greater than a side thickness thereof. In an example embodiment, the outer doped layer 140 may be formed only below the recess region R. In an example embodiment, the outer doped layer 140 may be formed only at a lower portion of the inner wall of the recess region R.

Figure 11:
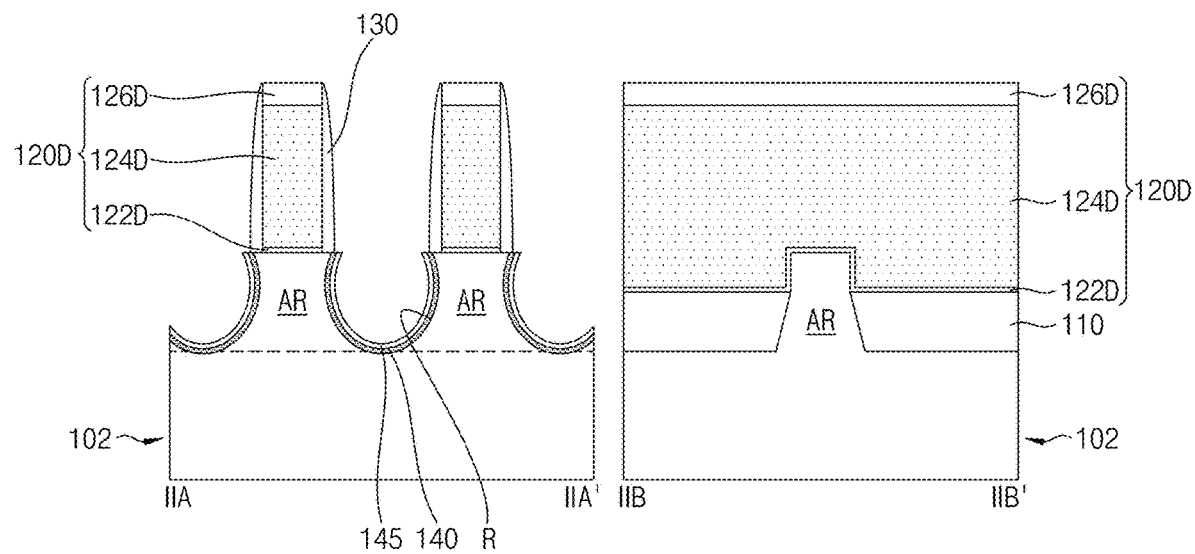

Referring to FIG. 11, an intermediate doped layer 145 may be formed on the outer doped layer 140. The intermediate doped layer 145 may be formed by selective epitaxial growth process using the outer doped layer 140 as a seed layer. The intermediate doped layer 145 may be doped with n-type impurities by an in-situ method. In an example embodiment, the intermediate doped layer 145 may include arsenic. In an example embodiment, the intermediate doped layer 145 may be formed conformally along an inner wall) of the outer doped layer 140. In an example embodiment, a thickness of the intermediate doped layer 145 may not be uniform.

Figure 12:
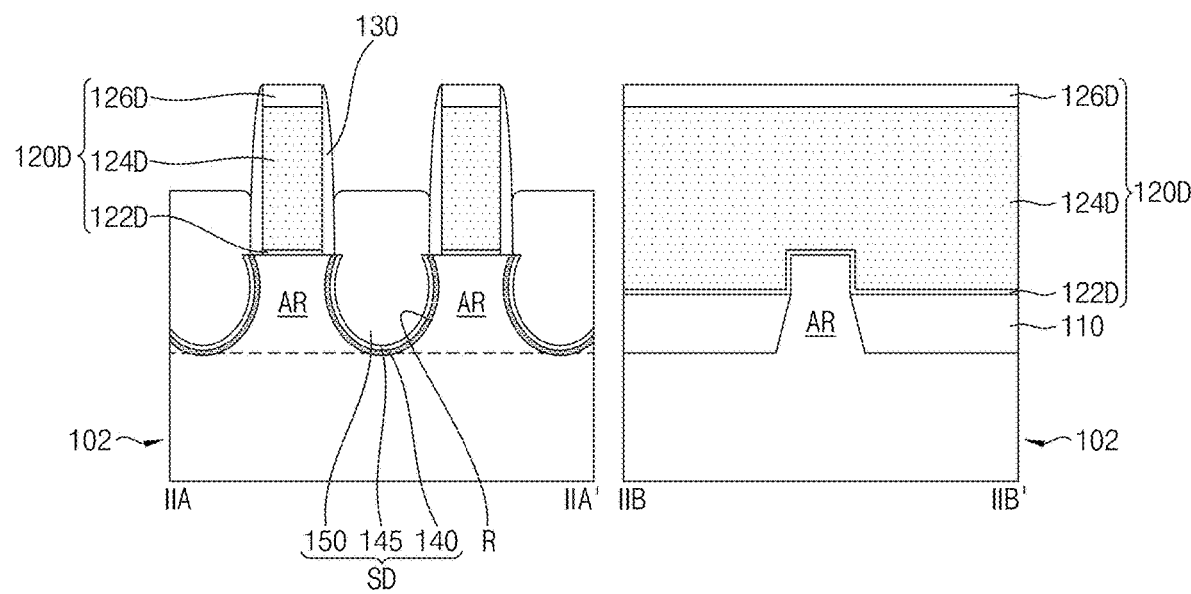

Referring to FIG. 12, an inner doped layer 150 may be formed on the intermediate doped layer 145 and fill the recess region R. The outer doped layer 140, the intermediate doped layer 145, and the inner doped layer 150 may form a source/drain region SD. The inner doped layer 150 may be formed by selective epitaxial growth process using the intermediate doped layer 145 as a seed layer. In an example embodiment, the inner doped layer 150 may include phosphorus. The upper surface of the inner doped layer 150 may be located at a level higher than a level of the upper surface of the active region AR.

Figure 13:
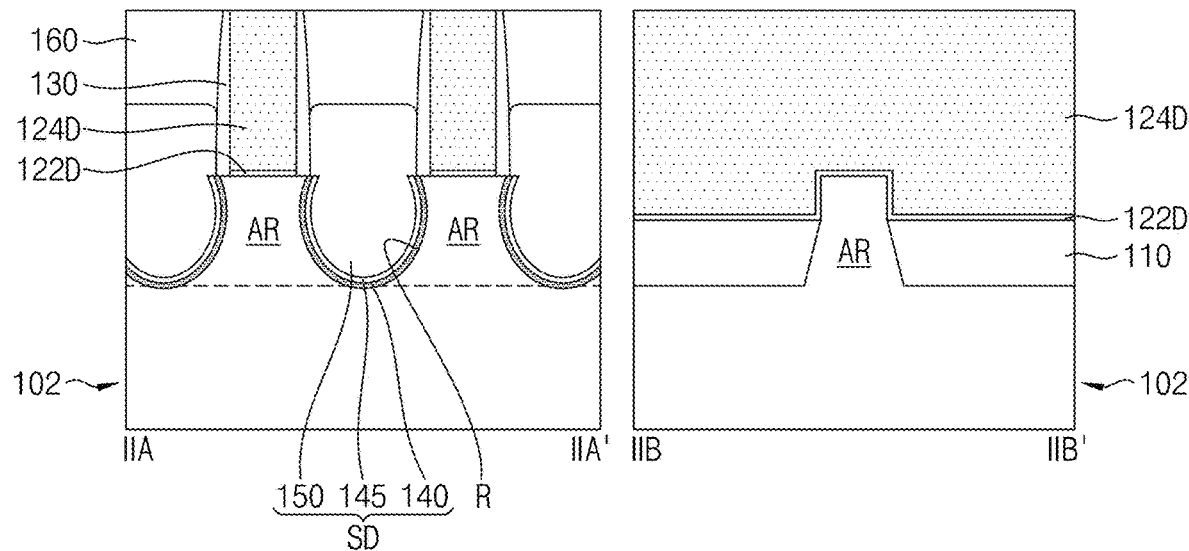

Referring to FIG. 13, an interlayer insulating layer 160 may be formed. The interlayer insulating layer 160 may cover the device isolation layer 110, the side surfaces of the gate spacers 130, and the source/drain region SD. The interlayer insulating layer 160 may include silicon oxide, silicon nitride, silicon oxynitride, or a low dielectric material. After the interlayer insulating layer 160 is formed, the dummy capping layer 126D may be removed by the planarization process, and the upper surface of the dummy gate electrode 124D may be exposed.

Figure 14:
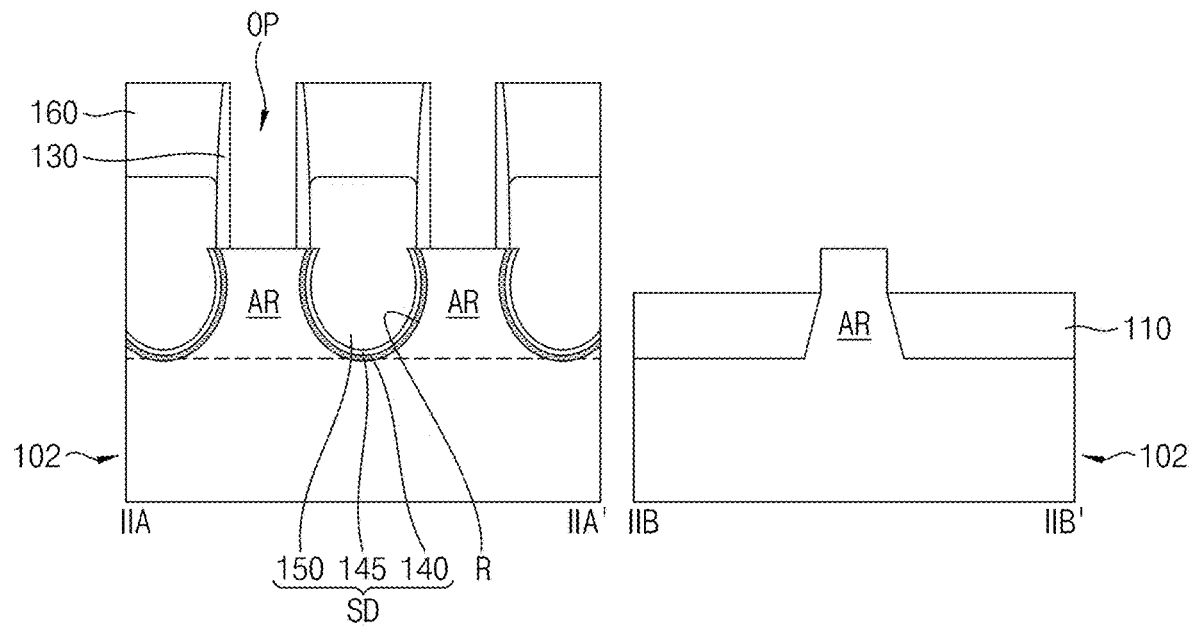

Referring to FIG. 14, an opening OP may be formed by removing the dummy gate insulating layer 122D and the dummy gate electrode 124D. A portion of the upper surface of the active region AR may be exposed by the opening OP. The dummy gate insulating layer 122D and the dummy gate electrode 124D may be removed by a wet etching process. The gate spacers 130 may have an etching selectivity with respect to the dummy gate insulating layer 122D and the dummy gate electrode 124D, and thus may not be removed in the etching process.

Referring back to FIG. 2, a gate insulating layer 122 and a gate electrode 124 may be formed in a space from which the dummy gate insulating layer 122D and the dummy gate electrode 124D are removed. The gate electrode 124 may extend in the second horizontal direction D2. The gate insulating layer 122 may be formed conformally along the surfaces of the device isolation layer 110, the active region AR, and inner walls of the gate spacers 130. The gate electrode 124 may be formed on the gate insulating layer 122.

Although not specifically illustrated in FIG. 14, referring back to FIG. 2, a capping layer 170 may be formed to cover an upper surface of the gate electrode 124, the gate spacers 130, and the interlayer insulating layer 160. The capping layer 170 may include silicon oxide, silicon nitride, silicon oxynitride, or a combination thereof.

Figure 15:
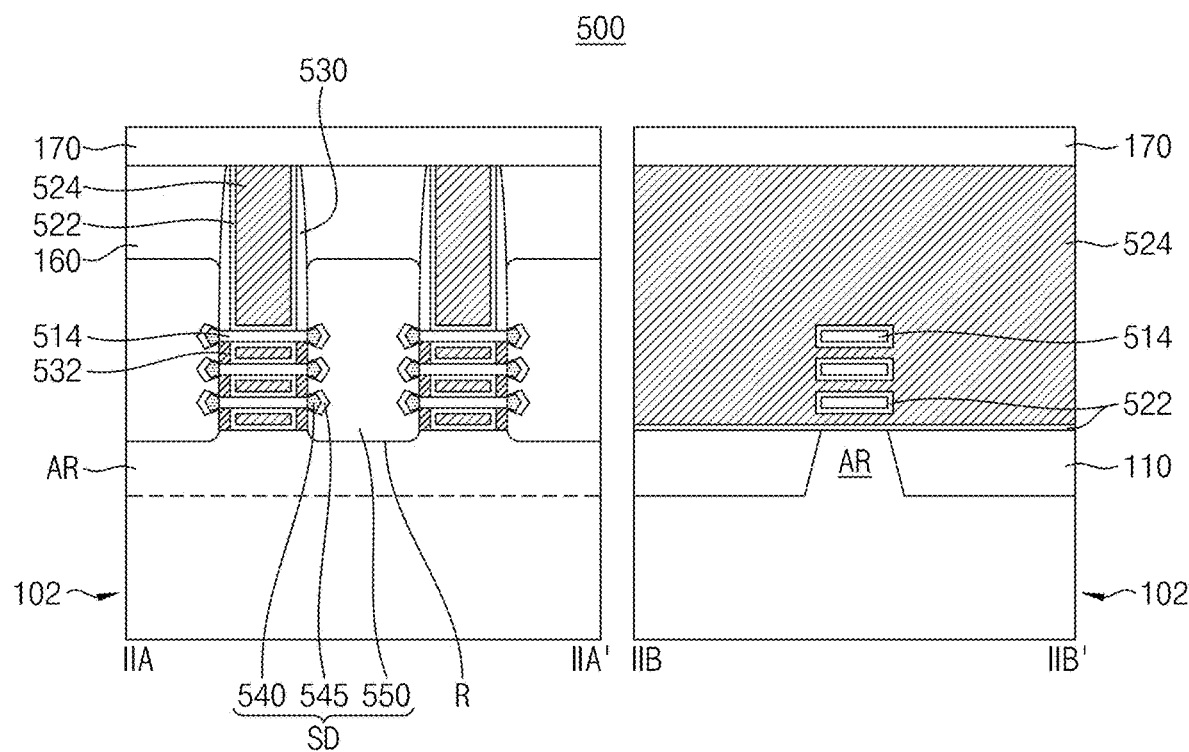
FIG. 15 are vertical cross-sectional views of the semiconductor device according to an example embodiment of inventive concepts.

FIG. 15 are vertical cross-sectional views of the semiconductor device according to an example embodiment of inventive concepts. Detailed description of components that are the same as or similar to those of the semiconductor device 100 shown in FIG. 2 may be omitted.

Referring to FIG. 15, a semiconductor device 500 may include a channel layer 514, a gate insulating layer 522, a gate electrode 524, gate spacers 530, and inner spacers 532. The semiconductor device 500 may further include a source/drain region SD including a recess region R, an outer doped layer 540, an intermediate doped layer 545, and an inner doped layer 550.

The channel layer 514 may be disposed between adjacent source/drain regions SD on the active region AR. The channel layer 514 may electrically connect adjacent source/drain regions SD with each other. The plurality of channel layers 514 may be spaced apart from each other in a vertical direction. In FIG. 15, the cross section of the channel layer 514 is in the form of a rectangular nanosheet, but is not limited thereto. In an example embodiment, the cross section of the channel layer 514 may be circular or elliptical. Each channel layer 514 may have a desired (or alternatively, predetermined) length along the first horizontal direction D1 and a desired (or alternatively, predetermined) length along the second horizontal direction D2.

The gate insulating layer 522 and the gate electrode 524 may extend in the second horizontal direction D2, and the gate insulating layer 522 may cover side surfaces of the gate electrode 524. The gate insulating layer 522 may surround the channel layer 514 when viewed in the cross-sectional view along the line IIB-IIB %. Further, the gate insulating layer 522 may cover the upper surface of the active region AR and the device isolation layer 110. The gate electrode 524 may extend to cross the active region AR and may surround the channel layer 514.

The gate spacers 530 may be disposed outside the gate electrode 524. For example, the gate spacers 530 may be disposed to face each other with respect to the gate electrode 524 interposed therebetween, and may extend in the second horizontal direction D2.

The inner spacers 532 may be disposed outside the gate electrode 524 along the first horizontal direction D1. The inner spacers 532 may be disposed to face each other with respect to the gate electrode 524 interposed therebetween. Each of the inner spacers 532 may be disposed on a lower surface of a corresponding one of the channel layers 514 and may contact the side surfaces of the source/drain region SD. The inner spacers 532 may electrically separate the gate electrode 524 from the source/drain region SD. In an example embodiment, the inner spacers 532 may include silicon nitride.

Figure 16:
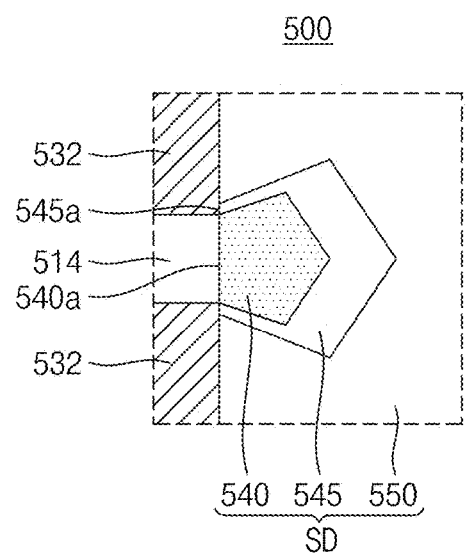
FIG. 16 is a partial enlarged view of the semiconductor device shown in FIG. 15.

FIG. 16 is a partial enlarged view of the semiconductor device shown in FIG. 15.

Referring to FIG. 16, the source/drain region SD may include the outer doped layer 540, the intermediate doped layer 545, and the inner doped layer 550. The outer doped layer 540 may contact the channel layer 514. The intermediate doped layer 545 may be disposed on the outer doped layer 540. Referring to FIG. 15, the inner doped layer 550 may cover the intermediate doped layer 545, and may contact the upper surface of the active region AR. The inner doped layer 550 may fill the recess region R formed on the upper surface of the active region AR. In an example embodiment, the outer doped layer 540 may be formed by selective epitaxial growth process using the channel layer 514 as a seed layer, and the intermediate doped layer 545 may be formed by selective epitaxial growth process using the outer doped layer 540 as a seed layer. The inner doped layer 550 may be formed by selective epitaxial growth process using the intermediate doped layer 545 as a seed layer. In an example embodiment, the outer doped layer 540 may include antimony, and the intermediate doped layer 545 may include arsenic. The inner doped layer 550 may include phosphorus.

In an example embodiment, the channel layer 514 may include single crystal silicon. In the selective epitaxial growth process, the growth rate of the epitaxial layer may vary depending on the crystallographic orientation of the silicon. For example, the epitaxially grown outer doped layer 540 with the channel layer 514 as a seed layer may have a pentagonal cross section. The intermediate doped layer 545 may also have a pentagonal cross section.

In an example embodiment, the intermediate doped layer 545 may surround and completely cover the outer surfaces of the outer doped layer 540. For example, the outer doped layer 540 may include a vertical inner side surface 540a in contact with the channel layer 514, and the intermediate doped layer 545 may include a vertical inner side surface 545a in contact with the inner spacer 532. An upper end of the inner side surface 545a of the intermediate doped layer 545 may be located at a level higher than a level of an upper end of the inner side surface 540a of the outer doped layer 540, and a lower end of the inner side surface 545a of the intermediate doped layer 545 may be located at a level lower than a level of a lower end of the inner side surface 540a of the outer doped layer 540.

Figure 17:
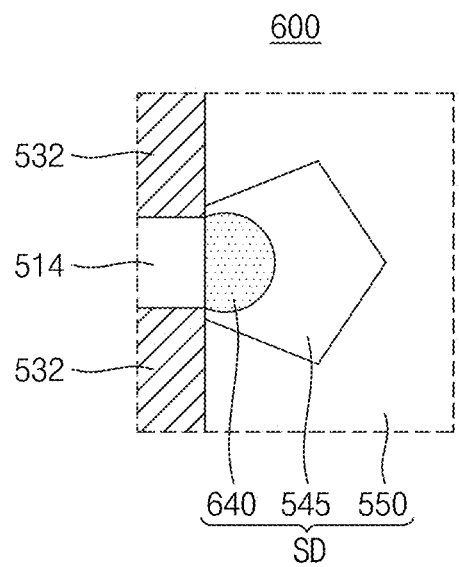
FIGS. 17-18 are partial enlarged views of the semiconductor devices according to some example embodiments of inventive concepts.
Figure 18:
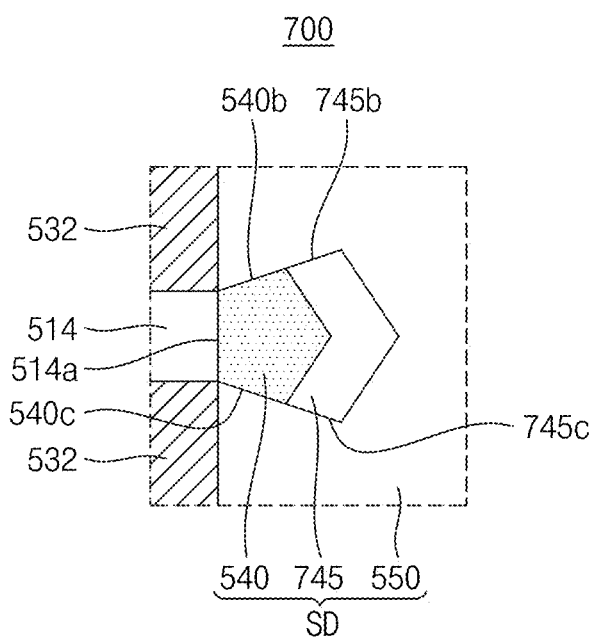

FIGS. 17-18 are partial enlarged views of the semiconductor devices according to some example embodiments of inventive concepts.

Referring to FIG. 17, a semiconductor device 600 may include a source/drain region SD including an outer doped layer 640, the intermediate doped layer 545, and the inner doped layer 550. In an example embodiment, if the outer doped layer 640 epitaxially grown from the channel layer 514 is not grown to a sufficient size, the cross section of the outer doped layer 640 along the first horizontal direction D1 may not be pentagonal. For example, the cross section of the outer doped layer 640 may be rounded. In FIG. 17, the cross section of the intermediate doped layer 545 is pentagonal, but is not limited thereto. In an example embodiment, the cross section of the intermediate doped layer 145 may be rounded.

Referring to FIG. 18, a semiconductor device 700 may include a source/drain region SD including the outer doped layer 540, an intermediate doped layer 745, and the inner doped layer 550.

The outer doped layer 540 may be adjacent to the channel layer 514, and may include surfaces 540b and 540c extending at a certain angle with respect to an outer surface 514a of the channel layer 514. The intermediate doped layer 745 may include an upper surface 745b and a lower surface 745c extending from the surfaces 540b and 540c of the outer doped layer 540, respectively. In an example embodiment, an angle that the upper surface 745b of the intermediate doped layer 745 makes with the outer surface 514a of the channel layer 514 may be the same as or substantially similar to an angle that the surface 540b of the outer doped layer 540 makes with the outer surface 514a of the channel layer 514.

FIGS. 19-27 are vertical cross-sectional views illustrating a method of manufacturing a semiconductor device shown in FIG. 15, according to an example embodiment of inventive concepts.

Figure 19:
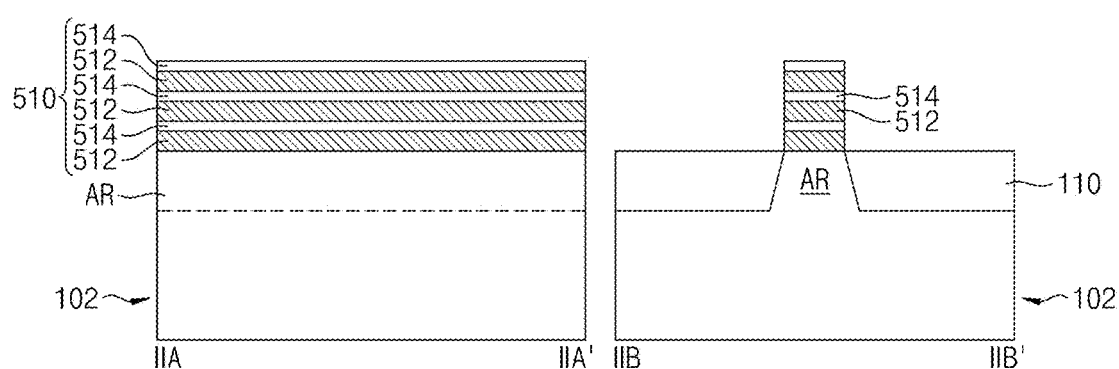
FIGS. 19-27 are vertical cross-sectional views illustrating a method of manufacturing a semiconductor device shown in FIG. 15, according to an example embodiment of inventive concepts.

Referring to FIG. 19, a stack 510 may be disposed on a substrate 102. The stack 510 may include a plurality of sacrificial layers 512 and channel layers 514 stacked alternately. In an example embodiment, the channel layers 514 may include the same material as the substrate 102, and the sacrificial layers 512 may include a material having an etch selectivity with respect to the channel layers 514. For example, the sacrificial layers 512 may include SiGe, and the channel layers 514 may include Si.

The stack 510 and an upper surface of substrate 102 may be patterned. The upper surface of the substrate 102 may be patterned to form an active region AR extending in the first horizontal direction D1. The patterned stack 510 may be disposed on the active region AR. A device isolation layer 110 may cover the upper surface of the substrate 102 and side surfaces of the active region AR.

Figure 20:
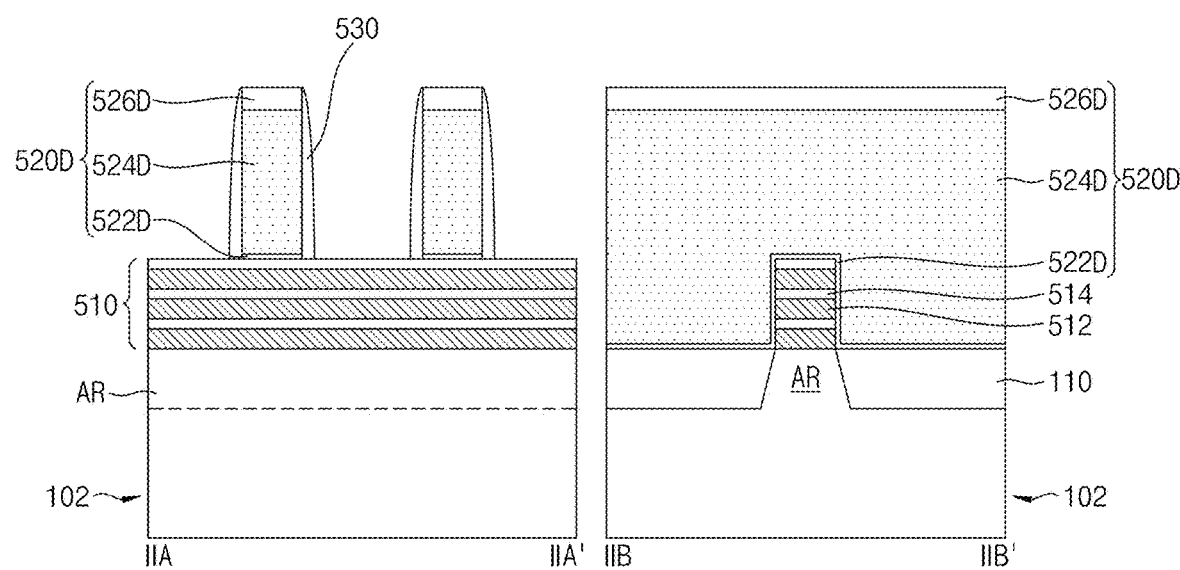

Referring to FIG. 20, a dummy gate structure 520D and gate spacers 530 may be formed. The dummy gate structure 520D may extend in the second horizontal direction D2 across the stack 510. The dummy gate structure 520D may include a dummy gate insulating layer 522D, a dummy gate electrode 524D, and a dummy capping layer 526D that are sequentially stacked. The gate spacers 530 may cover side surfaces of the dummy gate structure 520D and may be formed of one or more layers.

Figure 21:
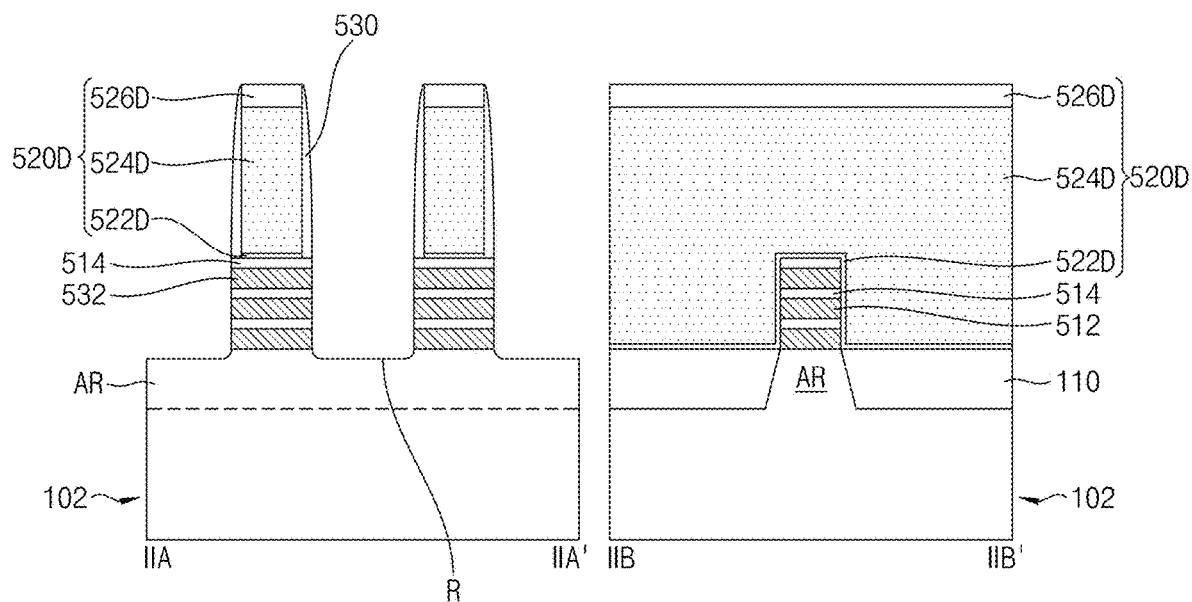

Referring to FIG. 21, portions of the sacrificial layers 512 and the channel layers 514 not covered by the dummy gate structure 520D may be removed. The sacrificial layers 512 and the channel layers 514 may be anisotropically etched using the gate spacers 530 as an etching mask. The active region AR may be exposed by the etching process. In an example embodiment, an upper portion of the active region AR may be partially etched to form a recess R.

Figure 22:
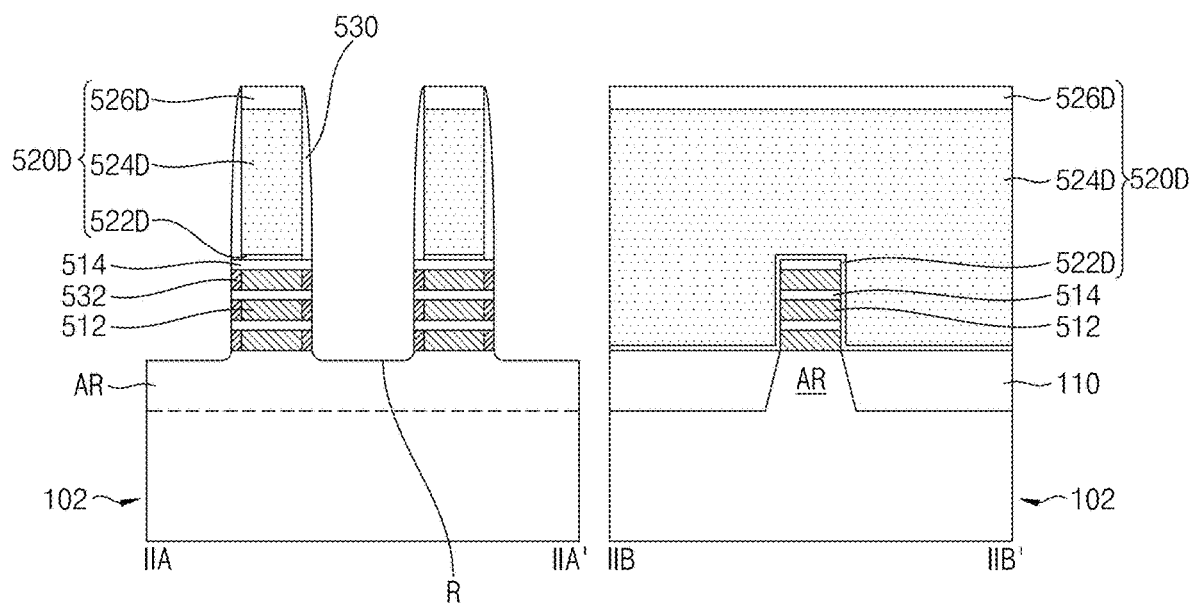

Referring to FIG. 22, inner spacers 532 may be formed. Side surfaces of the sacrificial layers 512 may be partially removed by an isotropic etching process, and upper or lower surfaces of the channel layers 514 may be partially exposed. An insulating material may be formed to cover the dummy gate structure 520D, the active region AR, and the exposed upper and lower surfaces of the channel layers 514. Thereafter, the insulating material may be removed by an anisotropic etching process and the inner spacers 532 may be formed on the side surfaces of the sacrificial layers 512. In forming the inner spacers 532, the channel layers 514 may not be etched. In other words, the insulating material for forming the inner spacers 532 may include a material having etching selectivity with regard to the channel layer 514.

The inner spacers 532 may be formed on side surfaces of the sacrificial layers 512. Further, the inner spacers 532 may be disposed between the plurality of channel layers 514 and between the channel layers 514 and the active region AR. Outer surfaces of the inner spacers 532 may be coplanar with outer surfaces of the channel layers 514. The inner spacers 532 may include silicon nitride.

Figure 23:
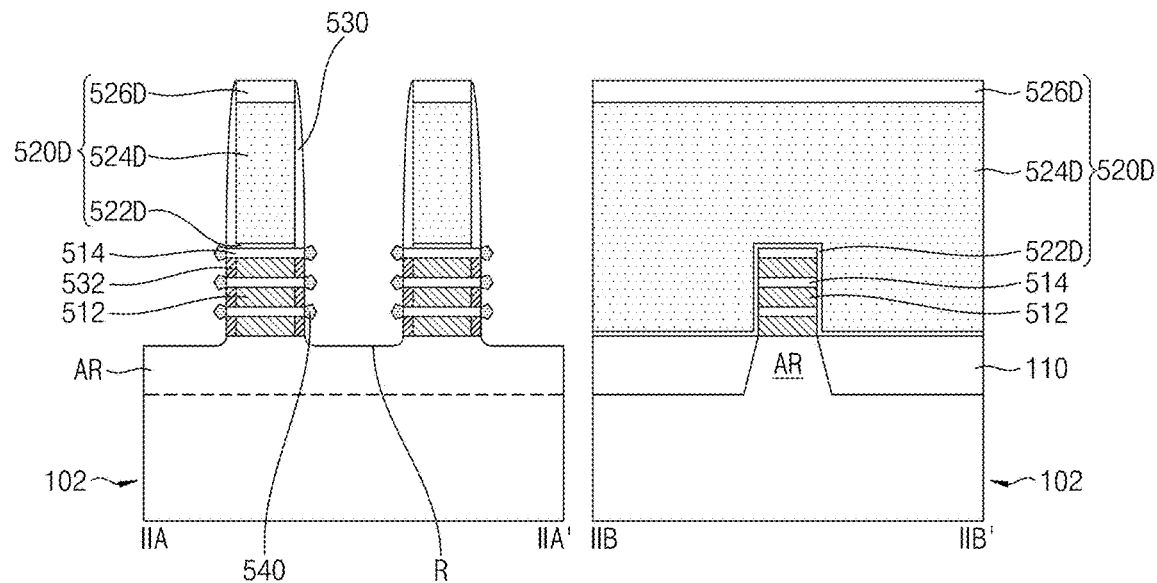

Referring to FIG. 23, an outer doped layer 540 may be formed in contact with the channel layers 514. In an example embodiment, the outer doped layer 540 may be formed by selective epitaxial growth process using the channel layers 514 as a seed layer. The outer doped layer 540 may be doped with n-type impurities by an in-situ method. For example, the outer doped layer 540 may include antimony. In an example embodiment, the outer doped layer 540 may have a pentagonal cross section. In an example embodiment, the cross section of the outer doped layer 540 may be rounded.

Figure 24:
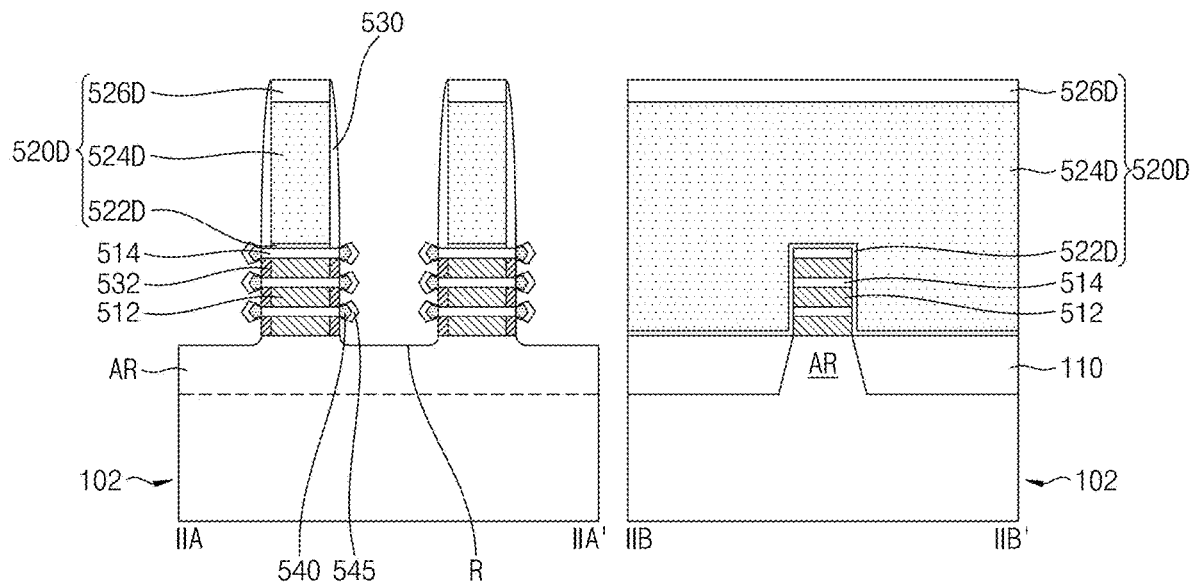

Referring to FIG. 24, an intermediate doped layer 545 may be formed on the outer doped layer 540. The intermediate doped layer 545 may have a pentagonal cross section. In an example embodiment, the intermediate doped layer 545 may be formed by selective epitaxial growth process using the outer doped layer 540 as a seed layer. In an example embodiment, the intermediate doped layer 545 may include arsenic.

Figure 25:
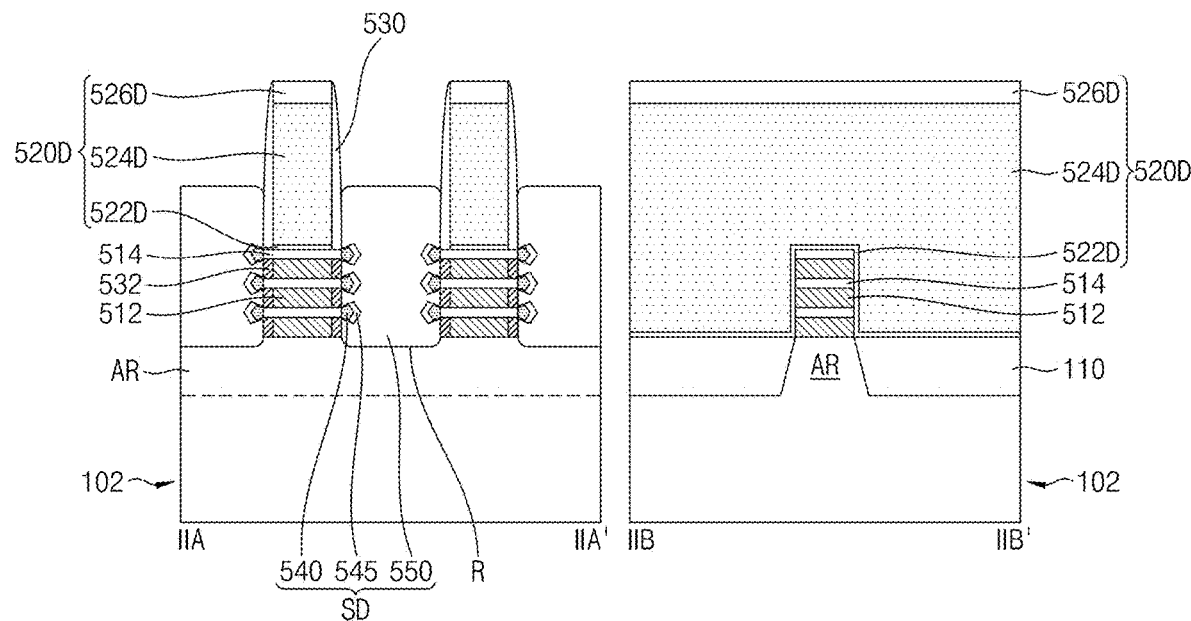

Referring to FIG. 25, an inner doped layer 550 may be formed to cover the intermediate doped layer 545 and contact the upper surface of the active region AR. The inner doped layer 550 may fill the recess region R formed on the upper surface of the active region AR. The inner doped layer 550 may be formed by selective epitaxial growth process using the intermediate doped layer 545 as a seed layer. In an example embodiment, the inner doped layer 550 may include phosphorus.

Figure 26:
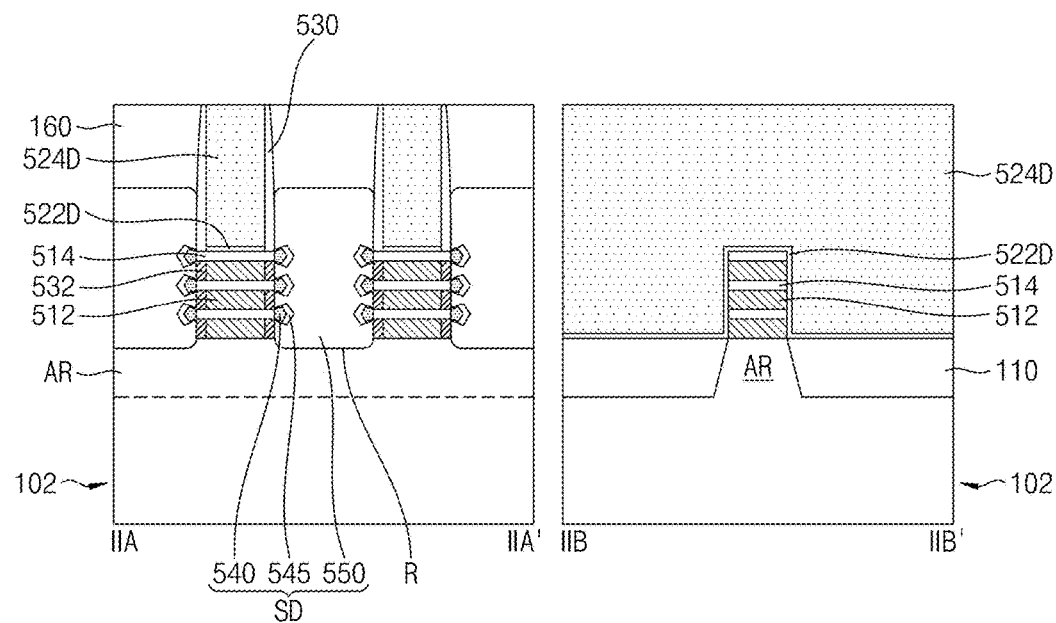

Referring to FIG. 26, an interlayer insulating layer 160 may be formed. The interlayer insulating layer 160 may cover the device isolation layer 110, the side surfaces of the gate spacers 530, and the source/drain region SD. After the interlayer insulating layer 160 is formed, the dummy capping layer 526D may be removed by the planarization process, and an upper surface of the dummy gate electrode 524D may be exposed.

Figure 27:
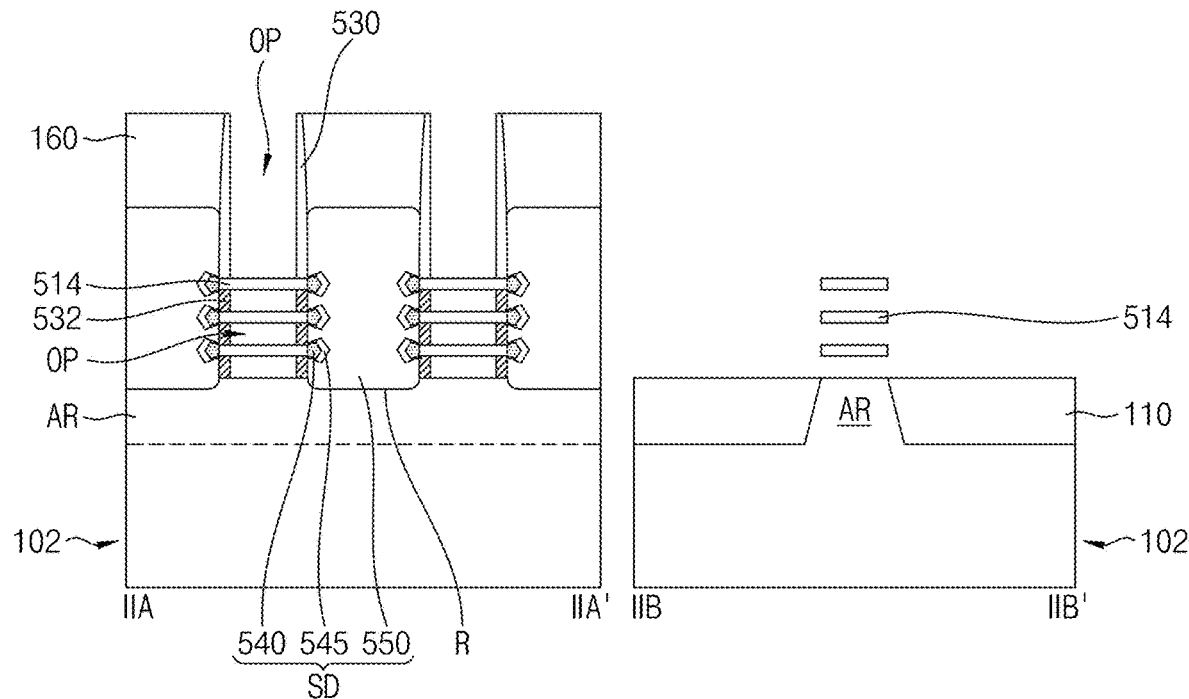

Referring to FIG. 27, an opening OP may be formed by removing the sacrificial layers 512, the dummy gate insulating layer 522D, and the dummy gate electrode 524D. The channel layers 514 may be exposed by the opening OP. The dummy gate insulating layer 522D and the dummy gate electrode 524D may be removed by a wet etching process to expose sacrificial layers 512. Then, the sacrificial layers 512 may be removed by a wet etching process. The gate spacers 530 and the inner spacers 532 may not be removed in the etching process.

Referring back to FIG. 15, a gate insulating layer 522 and a gate electrode 524 may be formed in a space from which the sacrificial layers 512, the dummy gate insulating layer 522D, and the dummy gate electrode 524D are removed. The gate electrode 524 may extend in the second horizontal direction D2. The gate insulating layer 522 may cover the side surfaces of the gate electrode 524 and may surround the channel layers 514. The gate electrode 524 may be formed on the gate insulating layer 522, and may surround the channel layers 514. A capping layer 170 may be formed to cover upper surfaces of the gate electrode 524, the gate spacer 530, and the interlayer insulating layer 160.

Figure 28:
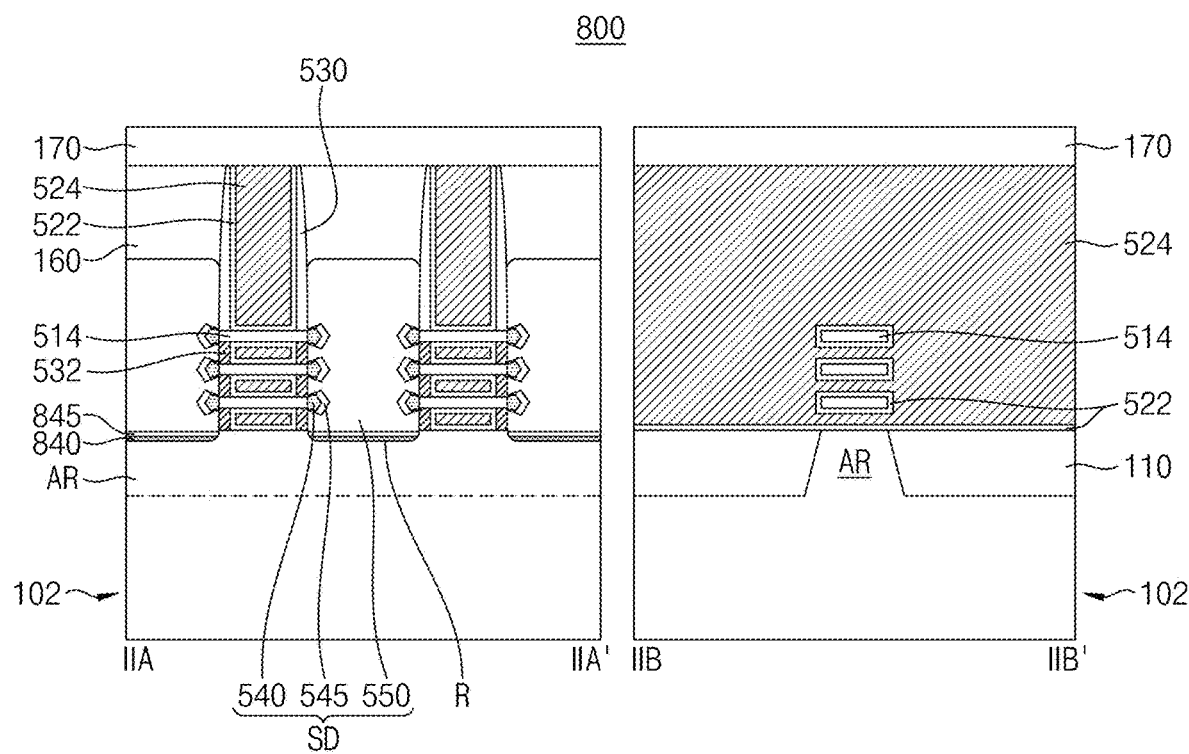
FIGS. 28-29 are vertical cross-sectional views of the semiconductor device according to some example embodiments of inventive concepts.
Figure 29:
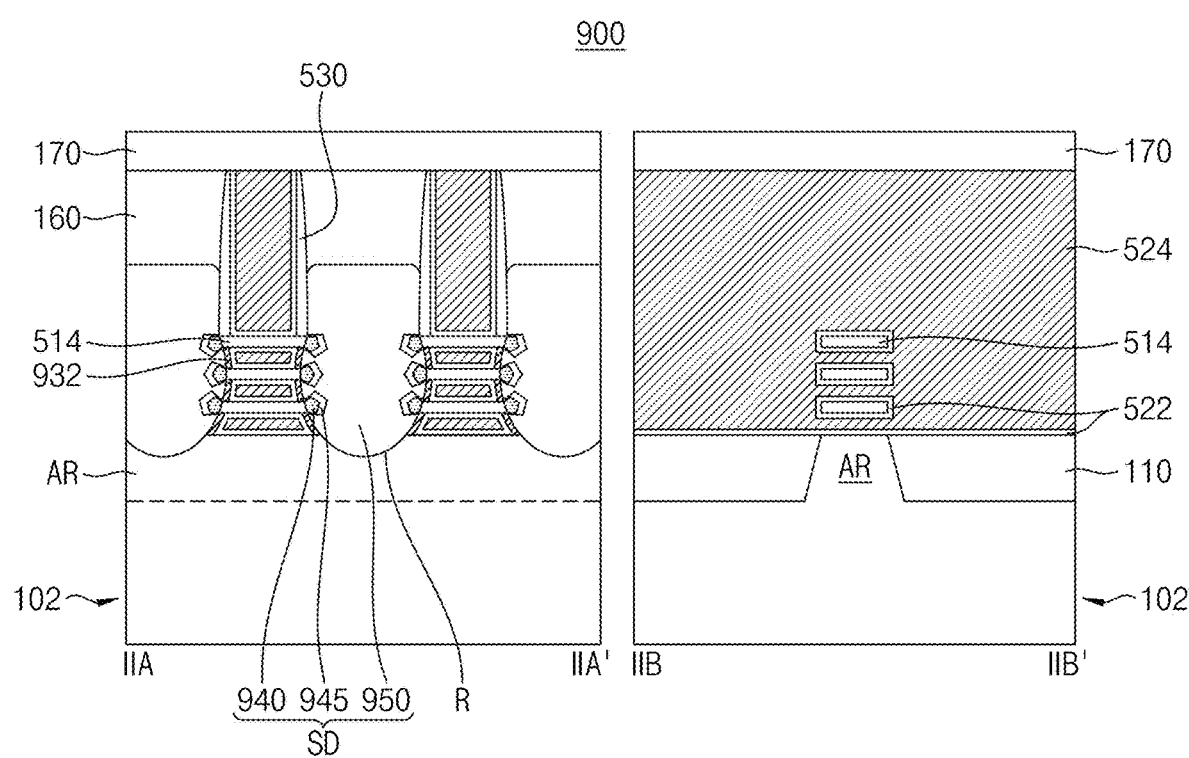

FIGS. 28-29 are vertical cross-sectional views of the semiconductor device according to some example embodiments of inventive concepts.

Referring to FIG. 28, a semiconductor device 800 may include a first lower doped layer 840 on an upper surface of the active region AR and a second lower doped layer 845 on the first lower doped layer 840. Referring to FIG. 23, the outer doped layer 540 may be formed by selective epitaxial growth process using the channel layers 514 as a seed layer. The active region AR may include the same material as the channel layers 514 and may include, for example, single crystal silicon. In the process of forming the outer doped layer 540, an epitaxial layer using the active region AR as a seed layer may be grown to form the first lower doped layer 840. In the process of forming the intermediate doped layer 545, the second lower doped layer 845 may be formed using the first lower doped layer 840 as a seed layer. The first lower doped layer 840 may include the same material as the outer doped layer 540, and the second lower doped layer 845 may include the same material as the intermediate doped layer 545. In an example embodiment, the first lower doped layer 840 may include antimony, and the second lower doped layer 845 may include arsenic.

Referring to FIG. 29, a semiconductor device 900 may include a source/drain region SD disposed between the gate electrodes 524. The source/drain region SD may include a first doped layer 940, a second doped layer 945, and a third doped layer 950. Referring to FIG. 21, the sacrificial layers 512 and the channel layers 514 may be partially removed by an etching process, and a recess region R may be formed. In the etching process, the sacrificial layers 512 and the channel layers 514 may be etched in the horizontal direction. Thereafter, inner spacers 932 and a source/drain region SD may be formed. A surface where the inner spacers 932 contact the source/drain region SD may be a curved surface. Side and lower surfaces of the source/drain region SD may be rounded. The first doped layer 940 and the second doped layer 945 may be inclined upward or downward. For example, an upper one of the first doped layers 940 positioned relatively above from among the plurality of first doped layers 940 may be inclined downward, and a lower one of the first doped layers 940 positioned relatively below from among the plurality of first doped layers 940 may be inclined upward.

According to example embodiments of inventive concepts, the source/drain region may include antimony underneath, so that diffusion of impurities in the source/drain region may be reduced or prevented.

While some example embodiments of inventive concepts have been described with reference to the accompanying drawings, it should be understood by those skilled in the art that various modifications may be made without departing from the scope of inventive concepts and without changing essential features thereof. Therefore, the above-described example embodiments should be considered in a descriptive sense only and not for purposes of limitation.

What is claimed is:

1. A semiconductor device comprising:
    an active region protruding from an upper surface of a substrate and extending in a first horizontal direction;
    a plurality of channel layers spaced apart from each other in a vertical direction on the active region;
    a plurality of gate electrodes extending in a second horizontal direction and surrounding the plurality of the channel layers, the second horizontal direction crossing the first horizontal direction; and
    a plurality of source/drain regions each disposed between an adjacent pair of the plurality of gate electrodes, each of the source/drain regions including outer doped layers in contact with the plurality of channel layers, intermediate doped layers covering the outer doped layers, and an inner doped layer covering the intermediate doped layers,
    wherein the outer doped layers include antimony, the intermediate doped layers include arsenic, and the inner doped layer include phosphorous.

2. The semiconductor device according to claim 1, wherein
    the outer doped layers protrude from the surfaces of the channel layers toward the inner doped layer, and
    the intermediate doped layer is disposed between the outer doped layers and the inner doped layers.

3. The semiconductor device according to claim 1, wherein the outer doped layers and the intermediate doped layers are epitaxially grown from the plurality of channel layers.

4. The semiconductor device according to claim 1, wherein
    the plurality of source/drain regions include a first outer doped layer and a second outer doped layer disposed at a same vertical level and spaced apart from each other with one of the plurality of gate electrodes disposed therebetween, and
    the first outer doped layer is connected to the second outer doped layer by one of the plurality of channel layers.

5. The semiconductor device according to claim 1, wherein
    at least one of the outer doped layers includes a first inner surface in contact with one of the channel layers, the first inner surface being coplanar with a side surface of one of the inner doped layer, and
    at least one of the intermediate doped layers includes a second inner surface coplanar with the first inner surface.

6. The semiconductor device according to claim 5, wherein a lower end of the second inner surface is located at a level lower than a lower end of the first inner surface, and an upper end of the second inner surface is located at a higher level than the upper end of the first inner surface.

7. The semiconductor device of claim 1, wherein an upper surface of the active region includes recess regions filled with the inner doped layer.

8. The semiconductor device according to claim 1, wherein the outer doped layers each have a pentagonal cross section.

9. The semiconductor device according to claim 1, wherein
at least one of the outer doped layers includes an inner surface in contact with one of the channel layers and two surfaces adjacent to the inner surface, the inner surface being coplanar with a side surface of the inner doped layer, and
at least one of the intermediate doped layers includes an upper surface and a lower surface each coplanar with the two surfaces.

10. The semiconductor device according to claim 9, wherein the two surfaces of at least one of outer doped layers are in contact with the inner doped layer.

11. The semiconductor device according to claim 1, wherein cross sections of the outer doped layers are rounded.

12. The semiconductor device according to claim 1, further comprising:
inner spacers on upper surfaces or lower surfaces of the plurality of channel layers and in contact with portions of the outer doped layers.

13. The semiconductor device according to claim 1, further comprising:
a first lower doped layer in contact with the active region; and
a second lower doped layer on the first lower doped layer.

14. The semiconductor device according to claim 13, wherein the first lower doped layer includes a same material as the outer doped layers, and the second lower doped layer includes a same material as the intermediate doped layers.

15. A semiconductor device comprising:
an active region protruding from an upper surface of a substrate and extending in a first horizontal direction;
a plurality of channel layers spaced apart from each other in a vertical direction on the active region;
a plurality of gate electrodes extending in a second horizontal direction and surrounding the plurality of the channel layers, the second horizontal direction crossing the first horizontal direction; and
a source/drain region each disposed between an adjacent pair of the plurality of gate electrodes, the source/drain region including outer doped layers in contact with the plurality of channel layers, intermediate doped layers covering the outer doped layers, and an inner doped layer covering the intermediate doped layers,
wherein the outer doped layers include antimony, the intermediate doped layers include arsenic, and the inner doped layer include phosphorous, and
side surfaces and a bottom surface of the source/drain region are rounded.

16. The semiconductor device according to claim 15, wherein
the plurality of channel layers include a first channel layer, a second channel layer and a third channel layer,
the second channel layer is disposed between the first channel layer and the third channel layer in the vertical direction, and
a length of the second channel layer in the first horizontal direction is smaller than lengths of the first channel layer and the third channel layer in the first horizontal direction.

17. The semiconductor device according to claim 16, wherein
the outer doped layers include first to third outer doped layers in contact with the first to third channel layers, respectively, and
the first outer doped layer is inclined downward and the third outer doped layer is inclined upward.

18. The semiconductor device according to claim 17, wherein the intermediate doped layers include first to third intermediate doped layers in contact with the first to third outer doped layers, respectively, and
wherein the first intermediate doped layer is inclined downward and the third intermediate doped layer is inclined upward.

19. The semiconductor device according to claim 15, further comprising:
inner spacers on upper surfaces or lower surfaces of the plurality of channel layers and in contact with portions of the outer doped layers, and
wherein the inner spacers are rounded.

20. A semiconductor device comprising:
an active region protruding from an upper surface of a substrate and extending in a first horizontal direction, the active region including a recess formed thereon;
a device isolation layer covering the upper surface of the substrate and side surfaces of the active region;
a plurality of channel layers spaced apart from each other in a vertical direction on the active region;
a plurality of gate electrodes extending in a second horizontal direction and surrounding the plurality of the channel layers, the second horizontal direction crossing the first horizontal direction;
gate insulating layers disposed between the plurality of channel layers and the plurality of gate electrodes or covering upper surfaces of the active region and the device isolation layer;
a plurality of source/drain regions each disposed between an adjacent pair of the plurality of gate electrodes, each of the source/drain regions including outer doped layers in contact with the plurality of channel layers, intermediate doped layers covering the outer doped layers, and an inner doped layer covering the intermediate doped layers and filling the recess; and
inner spacers on upper surfaces or lower surfaces of the plurality of channel layers and in contact with portions of the outer doped layers,
wherein the outer doped layers include antimony, the intermediate doped layers include arsenic, and the inner doped layer includes phosphorous.

* * * * *